(12) United States Patent
Kim et al.

(10) Patent No.: US 8,742,777 B2
(45) Date of Patent: Jun. 3, 2014

(54) METHOD AND SYSTEM FOR TESTING AN ELECTRIC CIRCUIT

(75) Inventors: Bruce C. Kim, Tuscaloosa, AL (US); Sukeshwar Kannan, Tuscaloosa, AL (US); Ganesh Srinivasan, Dallas, TX (US); Friedrich Taenzler, Plano, TX (US)

(73) Assignee: The Board of Trustees of the University of Alabama for and on behalf of the University of Alabama, Tuscaloosa, AL (US)

( * ) Notice: Subject to any disclaimer, the term of this patent is extended or adjusted under 35 U.S.C. 154(b) by 567 days.

(21) Appl. No.: 12/980,638

(22) Filed: Dec. 29, 2010

(65) Prior Publication Data
US 2012/0169359 A1 Jul. 5, 2012

(51) Int. Cl.
*G01R 31/28* (2006.01)

(52) U.S. Cl.
USPC ....... 324/750.01; 324/500; 324/612; 375/224

(58) Field of Classification Search
USPC ............. 324/500, 537, 601, 612, 750.02, 324/750.101, 763.01; 375/224
See application file for complete search history.

(56) References Cited

U.S. PATENT DOCUMENTS

| | | | |
|---|---|---|---|
| 4,737,111 A | 4/1988 | Minar et al. | |
| 5,220,276 A | 6/1993 | Kleefstra | |
| 5,357,191 A | 10/1994 | Grace | |
| 5,424,633 A | 6/1995 | Soiferman | |
| 5,555,507 A * | 9/1996 | Wolf et al. | 702/122 |
| 5,596,280 A * | 1/1997 | Riggio, Jr. | 324/606 |
| 5,786,697 A | 7/1998 | Khazam et al. | |
| 5,821,758 A | 10/1998 | Jindal | |
| 6,005,394 A | 12/1999 | Majka et al. | |
| 6,064,328 A | 5/2000 | Scheidig et al. | |
| 6,111,414 A | 8/2000 | Chatterjee et al. | |
| 6,144,210 A | 11/2000 | Brooks | |
| 6,268,719 B1 | 7/2001 | Swart | |
| 6,359,451 B1 | 3/2002 | Wallmark | |
| 6,392,402 B1 | 5/2002 | Swift | |
| 6,496,013 B1 | 12/2002 | Buks et al. | |
| 6,566,901 B2 * | 5/2003 | Ta et al. | 324/763.01 |

(Continued)

FOREIGN PATENT DOCUMENTS

EP          1152213 A1 * 11/2001

OTHER PUBLICATIONS

Lipshitz, Stanley P., et al., "Quantization and Dither: A Theoretical Survey," Journal of the Audio Engineering Society, vol. 40, No. 5, May 1992, pp. 355-375.

(Continued)

*Primary Examiner* — Arleen M Vazquez
*Assistant Examiner* — Robert P Alejnikov, Jr.
(74) *Attorney, Agent, or Firm* — Withrow & Terranova PLLC

(57) ABSTRACT

Embodiments include a method and system for testing an electric circuit. A carrier signal of a first frequency is modulated with a multi-tone signal to generate a test signal. The test signal is applied to an input of a circuit under test (CUT). A crest factor of an output signal that corresponds to the test signal received at an output of the CUT is measured. A crest factor differential between the measured crest factor and a reference crest factor is determined. If the crest factor differential exceeds a threshold value, the CUT is determined to be defective.

18 Claims, 6 Drawing Sheets

(56) References Cited

U.S. PATENT DOCUMENTS

| | | | |
|---|---|---|---|
| 6,727,712 B2 | 4/2004 | Sabey | |
| 6,734,681 B2 | 5/2004 | Sabey | |
| 6,788,078 B2 | 9/2004 | Swart | |
| 6,962,082 B2* | 11/2005 | Hashimoto et al. | 73/579 |
| 7,129,719 B2 | 10/2006 | Jung et al. | |
| 7,656,096 B2* | 2/2010 | Ribarich | 315/224 |
| 7,659,707 B2 | 2/2010 | Eken et al. | |
| 7,746,053 B2 | 6/2010 | Ribeiro et al. | |
| 8,396,149 B1* | 3/2013 | Zortea et al. | 375/260 |
| 8,409,186 B2* | 4/2013 | Behnke et al. | 606/33 |
| 2008/0025383 A1* | 1/2008 | Li | 375/226 |
| 2008/0068978 A1* | 3/2008 | Clausen | 370/201 |
| 2009/0261808 A1* | 10/2009 | Quan | 324/76.12 |

OTHER PUBLICATIONS

Carbone, Paolo et al., "Dither Signal Effects on the Resolution of Nonlinear Quantizers," IEEE Transactions on Instrumentation and Measurement, vol. 43, No. 2, Apr. 1994, pp. 139-145.

Carbone, Paolo et al., "Effect of Additive Dither on the Resolution of Ideal Quantizers," IEEE Transactions on Instrumentation and Measurement, vol. 43, No. 3, Jun. 1994, pp. 389-396.

Srinivasan, G., et al., "Accurate Measurement of Multi-Tone Power Ratio (MTPR) of ADSL Devices using Low-Cost Testers," Proceedings of the European Test Symposium (ETS '05), May 22-25, 2005, pp. 68-73.

Friese, Mathias, "Multitone Signals with Low Crest Factor," IEEE Transactions on Communications, vol. 45, No. 10, Oct. 1997, pp. 1338-1344.

Woodard, Sr., Ollie, C., "High Density Interconnect Verification of Unpopulated Multichip Modules," 11th IEEE/CHMT International Electronics Manufacturing Technology (IEMT) Symposium, Sep. 16-18, 1991, pp. 434-439.

Borland, William J., et al., "Embedded Passive Components in Printed Wiring Boards, a Technology Review," CircuiTree Magazine, vol. 14, Mar. 2001, 8 pages.

Fujimaki, Noboru et al., "Development of Printed Circuit Board Technology Embedding Active and Passive Devices for e-Function Module," Oki Technical Review, Issue 216, vol. 77, No. 1, Apr. 2010, 6 pages.

Kannan, Sukeshwar et al., "Automatic Diagnostic Tool for Analog-Mixed Signal and RF Load Boards," International Test Conference (ITC 2009), Austin, Texas, Dec. 18, 2009, 1 page.

Kannan, Sukeshwar et al., "Development of Automatic Program Generation Tool for Analog-Mixed Signal and Load Boards," IEEE RASDAT Workshop, Bangalore, India, Dec. 30, 2009, presented Jan. 8, 2010, 5 pages.

Kannan, Sukeshwar et al., "RADPro: Automatic RF Analyzer and Diagnostic Program Generation Tool," IEEE International Test Conference, Nov. 2-4, 2010, pp. 1-9.

Kim, Bruce et al., "Automatic Test Generation Tool for RF Device Interface Boards," IEEE Workshop on Test of Wireless Circuits and Systems, Santa Cruz, California, Apr. 2010, 5 pages.

* cited by examiner

| # OF TONES | 1 GHz | 5 GHz | 500 MHz | 100 MHz | 1 MHz |
|---|---|---|---|---|---|
| 10 | 0.6473 | 1.3068 | 1.6185 | 0.7811 | 0.6142 |
| 20 | 0.6473 | 1.1464 | 1.6185 | 0.7811 | 0.6727 |
| 50 | 0.1877 | 0.8123 | 0.9228 | 0.396 | 0.856 |
| 100 | 2.3224 | 2.5116 | 0.6735 | 1.502 | 1.7382 |
| 150 | 3.19 | 3.19 | 3.0572 | 2.7615 | 2.6308 |
| 200 | 3.5292 | 3.5292 | 3.1057 | 3.621 | 2.7931 |
| 256 | 3.6383 | 3.8473 | 4.141 | 4.0462 | 3.504 |

FIG. 4

METHOD AND SYSTEM FOR TESTING AN ELECTRIC CIRCUIT

FIELD OF THE DISCLOSURE

Embodiments disclosed herein relate generally to testing an electric circuit, and in particular to an electric circuit testing technique that uses a multi-tone test signal.

BACKGROUND

A Device Interface Board (DIB) (sometimes referred to as a "load board") is used to test radio frequency integrated circuits (RFIC). A DIB can include hundreds of mixed-signal and RF circuits with hundreds of active and passive components. Many of the RF circuits may be embedded in the layers of the DIB.

Before a DIB can be used to verify an RFIC, the electric circuits in the DIB itself must first be verified. Typically, in order to test a DIB, tester specific code is manually developed for testing the various electric circuits of the DIB. This process can take days, or months, for complex DIBs.

Similarly, the drive for smaller and smaller electronic devices has led to increased density of surface-mounted electric components on a printed circuit board (PCB), as well as the use of electric components embedded in a PCB. Testing, verifying, or diagnosing the electric circuits on, or embedded in, a PCB is typically either done manually, or via automated test equipment (ATE). Manual verification of electric circuits can be time-consuming and costly. The use of ATE eliminates much of the manual effort, but in turn, the ATE must be designed or programmed for a particular PCB, which is also time-consuming and costly.

Accordingly, there is a need for an efficient technique for testing electric circuits that can be applied to a variety of different electric circuits without the need to design or program ATE for each electric circuit.

SUMMARY

Embodiments disclosed herein relate to testing or validation of electric circuits. In one embodiment, a circuit under test (CUT) has an input port and an output port. A carrier signal at a first frequency is modulated with a multi-tone signal to generate a test signal. The test signal is applied, or otherwise provided, to the input port of the CUT. An output signal that corresponds to the input signal is received at the output port. A characteristic of the output signal is measured and compared to a reference characteristic, to determine a characteristic differential between the measured characteristic and the reference characteristic. The characteristic differential is compared to a predetermined threshold, and if the characteristic differential exceeds the predetermined threshold value, the CUT is determined to have a fault.

In one embodiment the characteristic is a crest factor characteristic. A reference crest factor is determined by applying a first test signal to the input port of a fault-free circuit that is identical to the CUT. The corresponding output signal is received, and the reference crest factor is determined. The first test signal is then provided to the CUT. A crest factor of the corresponding output signal is determined, and the measured crest factor is compared to the reference crest factor to determine a crest factor differential. If the crest factor differential exceeds a threshold value, the CUT is determined to contain a fault.

In one embodiment, the test signal comprises the same frequency as the carrier signal. The test signal comprises a plurality of different tones. In one embodiment, the test signal comprises in excess of two hundred tones.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4 is a table containing crest factor differentials identifying the difference between a reference crest factor and a measured crest factor of output signals that correspond to various test signals;

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Embodiments herein relate to testing and validation of electric circuits. A radio frequency (RF) carrier signal is modulated with a multi-tone signal to generate a test signal. The test signal is applied to an input port of a circuit under test (CUT). A characteristic, such as a crest factor, of the corresponding output signal is determined. The measured crest factor is compared to a reference crest factor, and if the crest factor differential exceeds a predetermined threshold value, the CUT is determined to contain a fault. The predetermined threshold value may simply be any crest factor differential greater than 0, or may be determined empirically.

Embodiments herein have applicability in testing a wide range of electric circuits, including circuits in printed circuit boards (PCBs), whether embedded within the PCBs or mounted on a surface of the PCBs; circuits implemented in low temperature co-fired ceramic (LTCC) multi-layer technology; and circuits implemented in integrated circuits.

Figure 1:
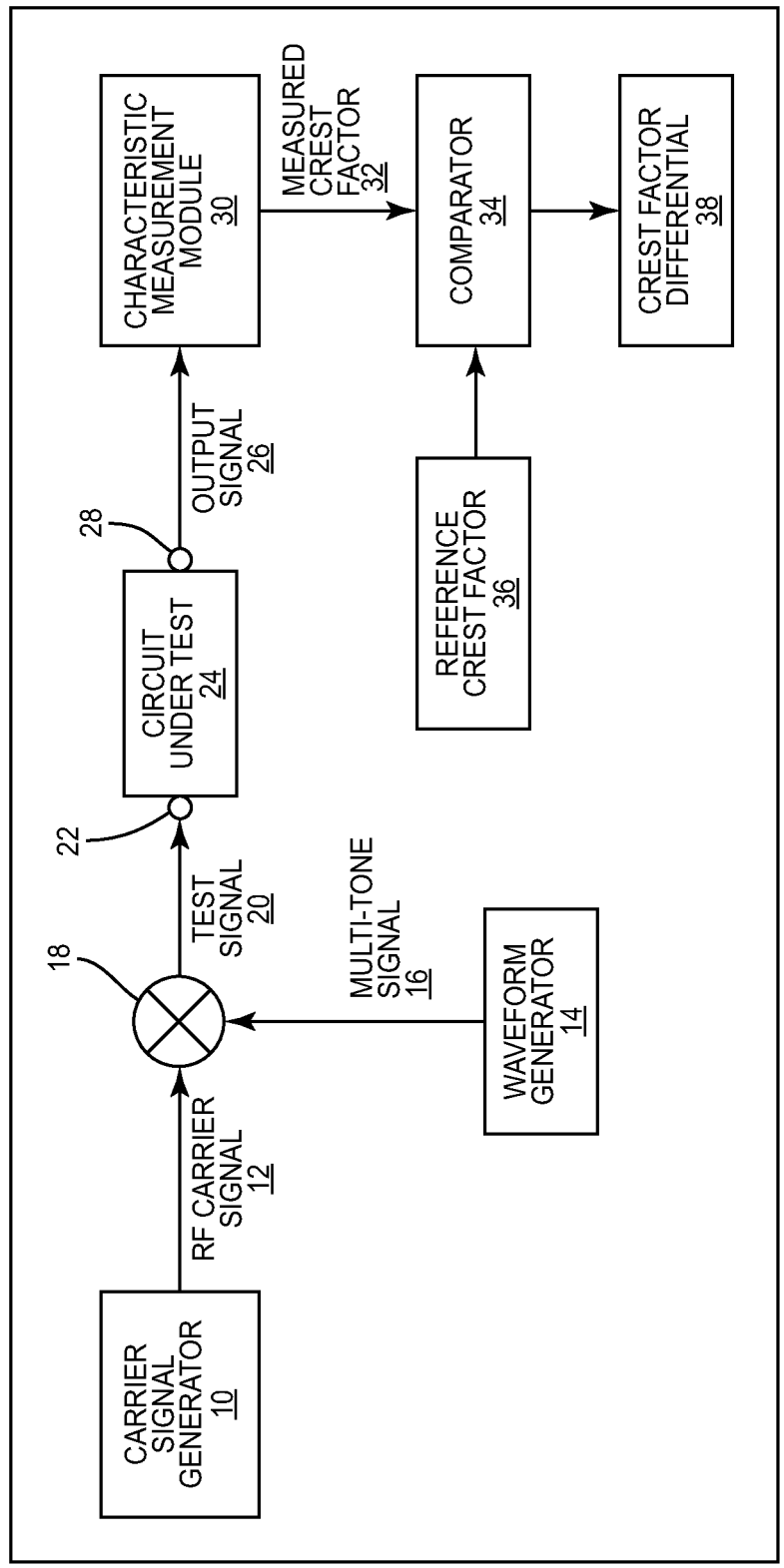
FIG. 1 is a block diagram illustrating a process for testing an electric circuit according to one embodiment.

FIG. 1 is a block diagram illustrating a process for testing an electric circuit according to one embodiment. A carrier signal generator 10 generates an RF carrier signal 12 at a desired first frequency. The desired first frequency may be based on attributes or characteristics of one or more CUTs. For example, an embedded passive copper trace will typically have certain design values such as length, height, and width. A copper trace may be modeled as a transmission line. For a signal to propagate in a transmission line and reach the output terminal, the length of the transmission line should typically be at least one fourth of the wavelength of the signal. Hence, the length of the copper trace may be used to determine the desired first frequency for a particular CUT. In one embodiment, this calculation may be performed for all CUTs for a particular board, such as a device interface board being tested, and an average length of such CUTs may be used to determine a desired first frequency.

A waveform generator 14, such as an arbitrary waveform generator (AWG), generates a multi-tone signal 16 comprising a plurality of tones. The multi-tone signal 16 is preferably at a frequency equal to the first frequency.

Preferably, the multi-tone signal 16 is generated with a random phase shift between the individual tones. The random phase shift may be obtained over a Gaussian distribution. The use of a Gaussian distribution enables the adjustment of the spacing between the tones. In one embodiment, additive white Gaussian noise may be added to the multi-tone signal 16 to replicate the testing environment for device-level testing.

The RF carrier signal 12 and the multi-tone signal 16 are modulated by a modulator 18, which generates a test signal 20 and provides the test signal 20 toward a CUT 24. The test signal 20 is preferably at a frequency equal to the first frequency. The test signal is provided, or otherwise applied, to an input port 22 of the CUT 24. The CUT 24 can comprise any RF circuitry, including, for example, a circuit embedded in a PCB, a circuit comprising surface-mount components, a circuit comprising a combination of surface-mount components and components embedded in a PCB, a circuit packaged in an LTCC multi-layer technology, a circuit implemented in an integrated circuit, or the like.

An output signal 26 that corresponds to the test signal 20 is received at an output port 28 of the CUT 24. A characteristic of the output signal 26 is measured by a characteristic measurement module 30. In one embodiment, the characteristic is a measured crest factor of the output signal 26. Any suitable crest factor measurement modules may be used, however, one suitable crest factor measurement module is the Analog Devices 450 MHz to 6 GHz crest factor detector (part number ADL5502) available from Analog Devices, Inc., 3 Technology Way, Norwood, Mass. 02062.

The measured crest factor 32 is provided to a comparator 34. The comparator 34 compares the measured crest factor 32 to a reference crest factor 36 to determine a crest factor differential 38. If the crest factor differential 38 exceeds a predetermined threshold value, it is determined that the CUT 24 contains a fault. An output module may then generate a signal indicating that the CUT 24 is defective.

In one embodiment, the reference crest factor 36 is generated by applying the test signal 20 to a fault-free circuit that contains the same components as the CUT 24, and is thus otherwise identical to the CUT 24. The crest factor of the output signal 26 from the fault-free circuit is then determined, and is saved as the reference crest factor 36 for comparison to a measured crest factor 32.

Figure 2:
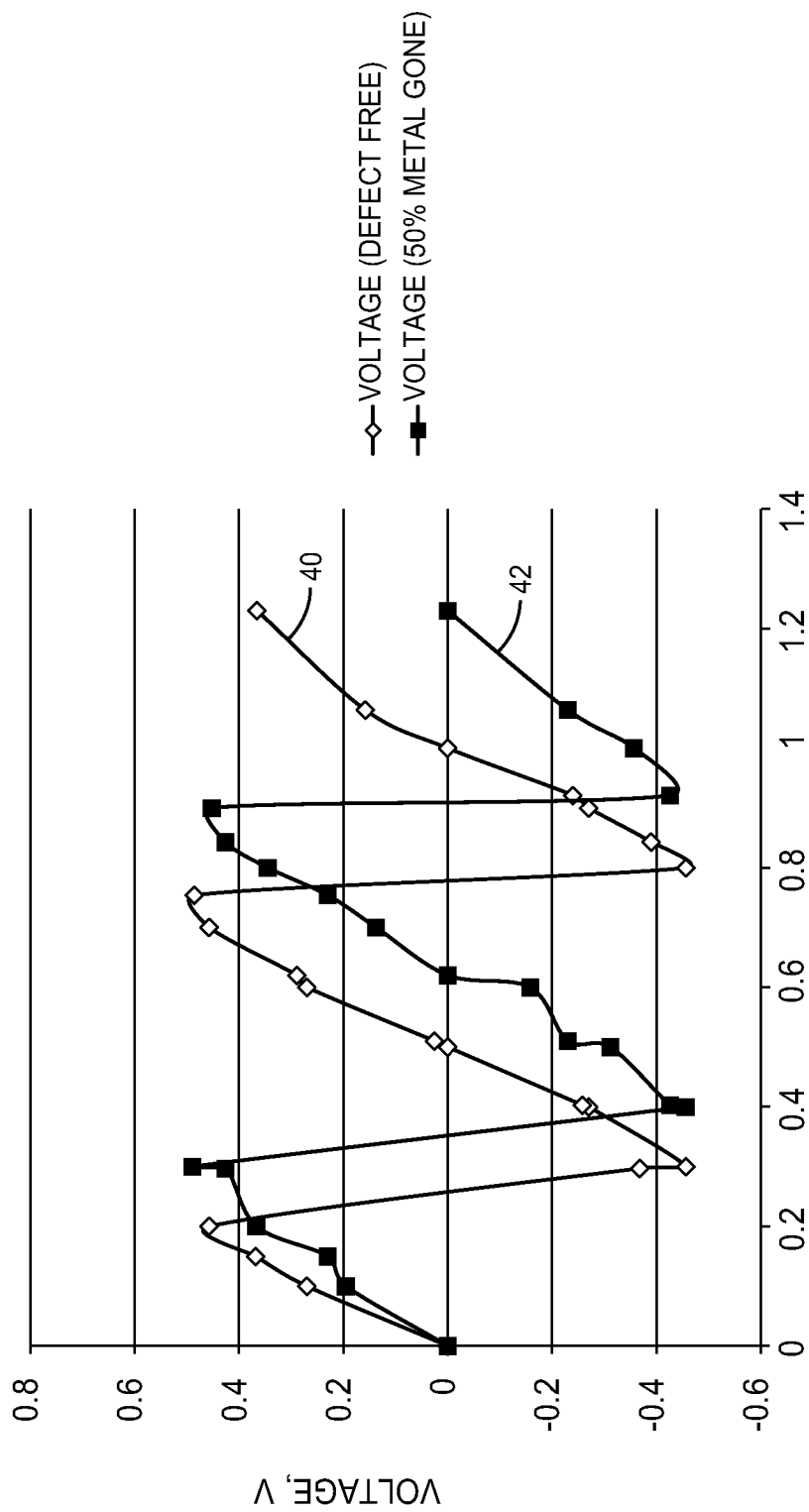
FIG. 2 is a graph illustrating exemplary output voltages of two output signals received from two electric circuits after application of a test signal.

FIG. 2 is a graph illustrating exemplary output voltages of two output signals received from two electric circuits after application of a test signal. Output voltage 40 is the output voltage of an output signal received from a fault-free first electric circuit. Output voltage 42 is the output voltage of an output signal 26 received from a second electric circuit that is identical to the first electric circuit except that the second electric circuit contains a "near open" defect. As illustrated, the phase of the output voltage 42 differs from the phase of the output voltage 40, and thus provides a mechanism for determining defects in an electric circuit. The phase difference between the output voltage 42 and the output voltage 40 results in a difference in the root-mean-square (RMS) values of the output voltage 42 and the output voltage 40. FIG. 2 illustrates the phase shift of an output voltage associated with a single tone. The extent of phase shift caused by a defective electric circuit may differ at different frequencies. Thus, use of a multi-tone signal 16 comprising a plurality of tones enables the determination of a cumulative phase shift difference associated with a plurality of different tones. This cumulative phase shift difference results in a significant difference in crest factor between a reference multi-tone output signal 26 received from a fault-free electric circuit and a multi-tone output signal 26 received from an electric circuit having a fault.

In one embodiment, the multi-tone signal 16 consists of N tones of sinusoidal waves, each separated by an angular frequency (change in phase). The phases for the N tones may be generated over a Gaussian distribution in a random fashion. Each individual tone is represented by the product of its amplitude ($a_k$) and angular frequency ($\omega$). The angular frequency is represented as a complex number. The multi-tone signal 16 in complex form is mathematically represented by the following equation:

$$a(t) \sum_{k=0}^{N-1} a_k \cdot e^{jk\Delta\omega t} \qquad (1)$$

wherein the multi-tone signal 16 is denoted by a(t). The first tone is considered the fundamental tone with angular frequency $\omega_0$, and the change in angular frequency is $\Delta\omega = 2\pi/T$. a(t) is periodic with period T. The complex part is converted to real and the sine of the function is reduced to zero. The multi-tone signal 16 may then be represented by the following equation:

$$a(t) = \sum_{k=0}^{N-1} |a_k| \cos(\omega_0 + k\Delta\omega) t \qquad (2)$$

The crest factor of a signal may be determined in accordance with the following:

$$CF = \frac{Vpeak}{Vrms} \qquad (3)$$

$$V_{peak} = \max_t \{|a(t)|\} \qquad (4)$$

$$V_{rms} = \sqrt{\lim_{x \to N} \frac{1}{2x} \int_0^N a^2(t) \, dt} \qquad (5)$$

Interested readers can obtain additional information regarding crest factors of a multi-tone signal and measurement thereof in the publication "Multitone Signals with Low Crest Factor," by Mathias Friese, *IEEE Transactions on Communications*, Vol. 45, No. 10, October 1997, which is hereby incorporated herein by reference in its entirety.

Figure 3A:
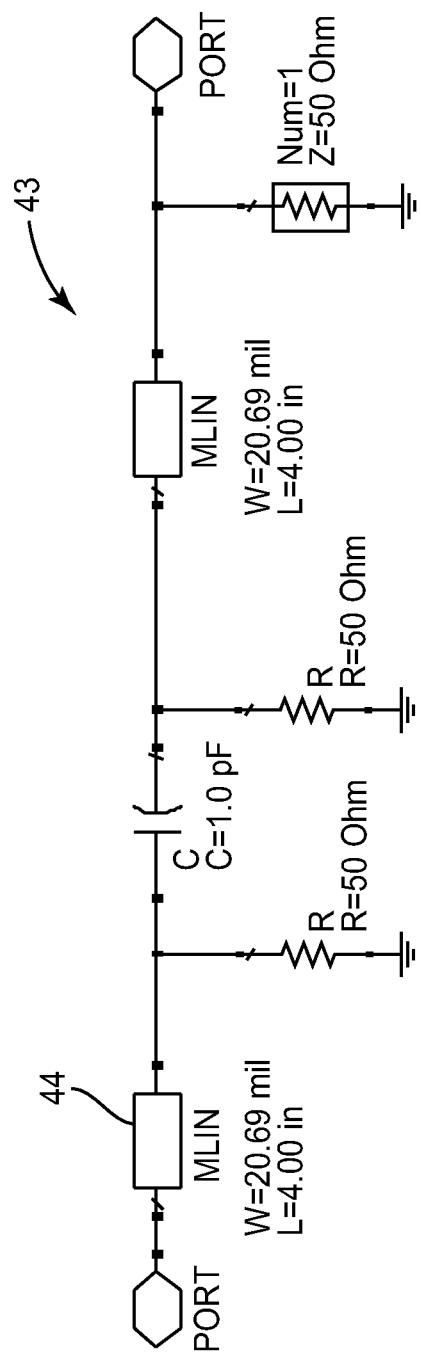
FIG. 3A illustrates an exemplary fault-free circuit.
Figure 3B:
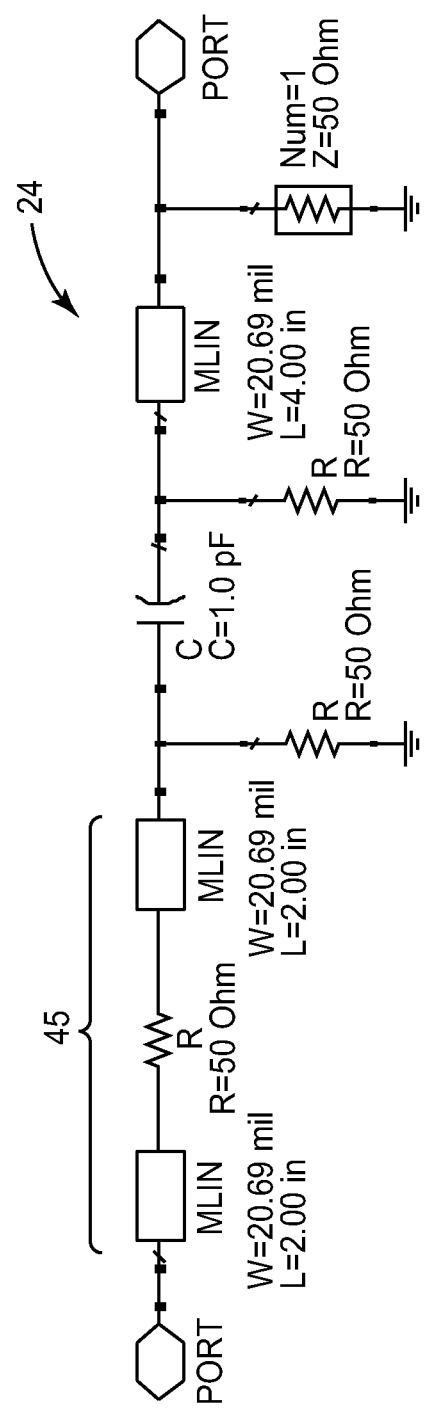
FIG. 3B illustrates an exemplary circuit under test (CUT) that has a "near open" defect but is otherwise identical to the circuit shown in FIG. 3A.

FIG. 3A illustrates an exemplary fault-free circuit 43, which includes a passive metal trace 44. FIG. 3B illustrates a CUT 24 that contains a near open defect but is otherwise identical to the fault-free circuit 43 illustrated in FIG. 3A. The near open defect is modeled as depicted by components 45, in essence a passive metal trace having a certain resistance (i.e, 50 ohms in this example). The CUT 24 was tested with a number of test signals 20, each having a different carrier frequency and a different number of tones. The crest factors of the corresponding output signals 26 were then measured.

FIG. 4 illustrates a table 46 that contains crest factor differentials 38 identifying the difference between a reference crest factor 36 obtained from the circuit 43 illustrated in FIG. 3A and a measured crest factor 32 of output signals 26 that correspond to various test signals 20. Each of columns 50A-50E relates to a test signal 20 of a particular frequency. Rows 52A-52G relate to test signals 20 with different numbers of tones. For example, cell 54A indicates a crest factor differential 38 of 2.3224 dB. This was determined by first applying a one-hundred-tone test signal 20 having a frequency of 1 GHz to an input port of the fault-free circuit 43 as illustrated in FIG. 3A, and measuring the crest factor of the output signal received from the circuit 43 to determine a reference crest factor 36. An identical one-hundred-tone test signal 20 having a frequency of 1 GHz was then applied to the CUT 24 illustrated in FIG. 3B, and the crest factor of the corresponding output signal 26 was measured. The cell 54A indicates that the crest factor differential 38 between the measured crest factor 32 of the output signal 26 from the defective CUT 24 and the reference crest factor 36 was 2.3224 dB. The other cells in the table 46 illustrate other exemplary crest factor differentials 38 using test signals 20 at various frequencies and with various numbers of tones.

Figure 5:
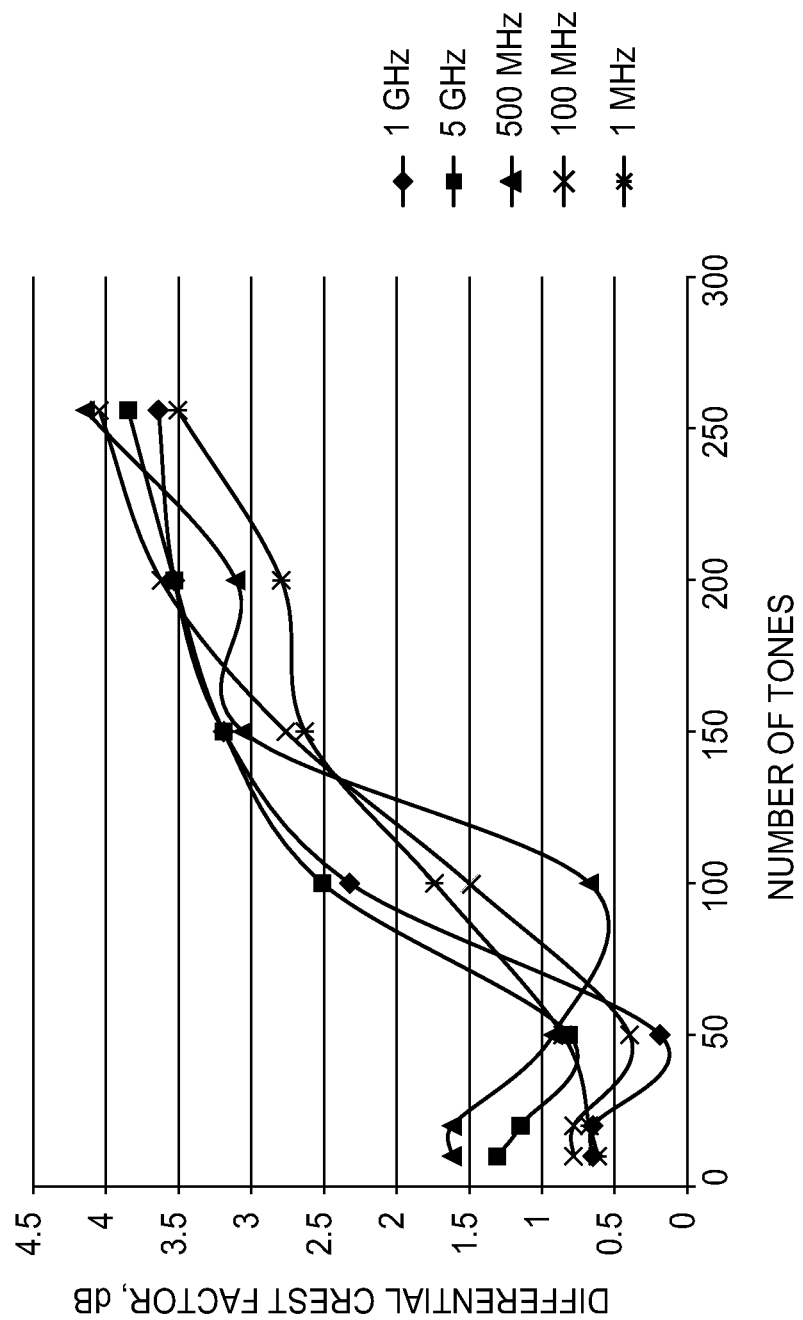
FIG. 5 is a graph illustrating crest factor differentials shown in FIG. 4.

FIG. 5 is a graph illustrating the crest factor differentials 38 in dBs contained in the table 46 between reference crest factors 36 and measured crest factors 32 at various frequencies and numbers of tones.

Figure 6:
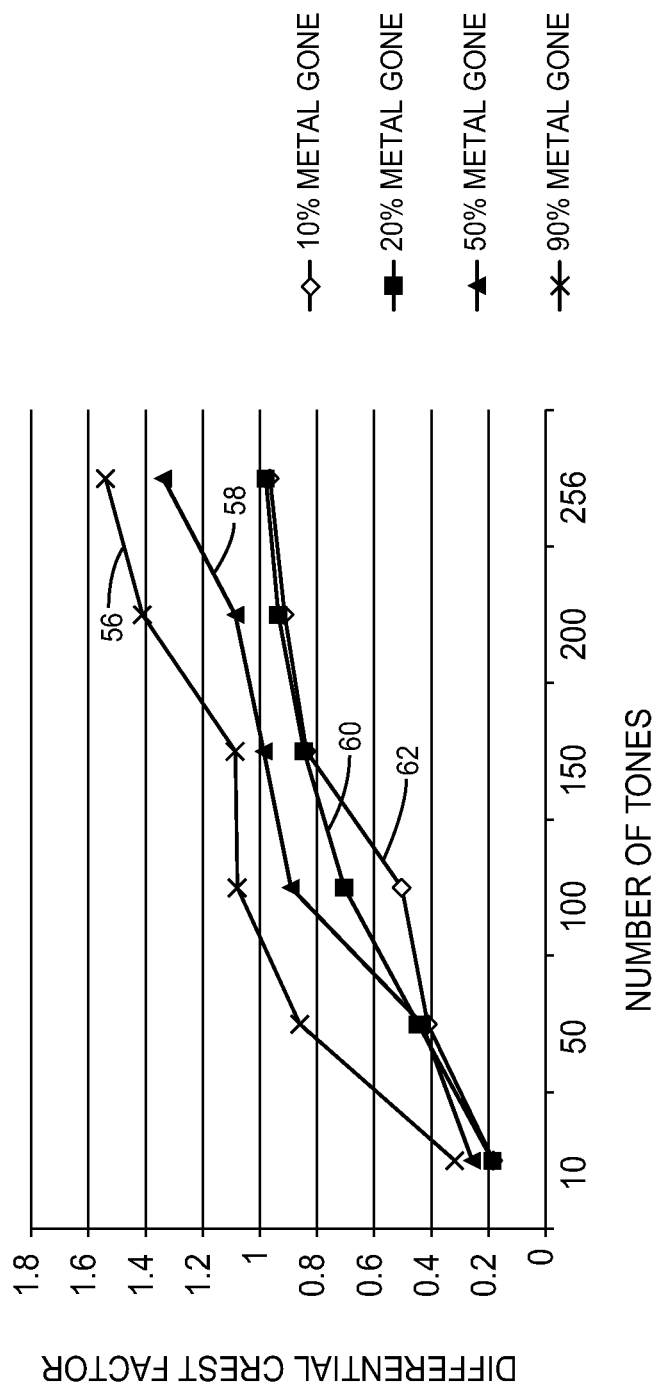
FIG. 6 is a graph illustrating a crest factor differential for various multi-tone test signals having a 1 GHz frequency, for four defective electric circuits which were identical other than the amount of metal missing from a resistive trace.

FIG. 6 is a graph illustrating a crest factor differential 38 for various multi-tone test signals 20 having a 1 GHz frequency, for four defective electric circuits which are identical except for the amount of metal missing from a resistive trace. Curve 56 illustrates crest factor differentials 38 between reference crest factors 36 and measured crest factors 32 based on various 1 GHz multi-tone test signals 20 applied to an electric circuit where 90% of the metal in a resistive trace was removed. Curve 58 illustrates crest factor differentials 38 between reference crest factors 36 and measured crest factors 32 based on various 1 GHz multi-tone test signals 20 applied to an electric circuit where 50% of the metal in the resistive trace was removed. Curve 60 illustrates crest factor differentials 38 between reference crest factors 36 and measured crest factors 32 based on various 1 GHz multi-tone test signals 20 applied to an electric circuit where 20% of the metal in the resistive trace was removed. Curve 62 illustrates crest factor differentials 38 between reference crest factors 36 and measured crest factors 32 based on various 1 GHz multi-tone test signals 20 applied to an electric circuit where 10% of the metal in the resistive trace was removed.

The present embodiments have applicability in the testing or validation of a wide range of electric circuits and eliminate the need to develop special-purpose testing software for each CUT.

What is claimed is:

1. A method for testing an electric circuit for a defect, comprising:
   modulating a carrier signal of a first frequency with a multi-tone signal to generate a test signal;
   applying the test signal to an input of the electric circuit;
   determining a crest factor of an output signal that corresponds to the test signal received at an output of the electric circuit;
   determining a crest factor differential between the crest factor and a reference crest factor; and
   determining that the electric circuit is defective if the crest factor differential exceeds a threshold value.

2. The method of claim 1, further comprising:
   comparing the crest factor differential to a threshold value; and
   identifying the electric circuit as defective based on the comparison.

3. The method of claim 1, wherein the reference crest factor is determined by:
   applying the test signal to an input of a fault-free electric circuit; and
   determining the reference crest factor of an output signal that corresponds to the test signal received at an output of the fault-free electric circuit.

4. The method of claim 1, wherein the test signal has a frequency equal to the first frequency.

5. The method of claim 4, wherein the multi-tone signal has a frequency equal to the first frequency.

6. The method of claim 1, wherein the electric circuit comprises an electric circuit embedded in a printed circuit board (PCB).

7. The method of claim 6, wherein the electric circuit further comprises at least one surface-mounted component mounted to a surface of the PCB.

8. The method of claim 1, wherein the electric circuit comprises an electric circuit in an integrated circuit.

9. The method of claim 1, wherein the electric circuit comprises an electric circuit implemented in low temperature co-fired ceramic (LTCC) multi-layer technology.

10. The method of claim 1, wherein the multi-tone signal comprises in excess of one hundred tones.

11. A method for testing an electric circuit for a defect, comprising:
    applying a test signal of a first frequency comprising a carrier reference signal modulated by a multi-tone signal to an input of the electric circuit;
    determining a measured characteristic of an output signal received at an output of the electric circuit in response to the test signal;
    determining whether a characteristic differential between the measured characteristic and a reference characteristic exceeds a threshold value; and
    determining that the electric circuit is defective if the characteristic differential exceeds the threshold value.

12. The method of claim 11, wherein the measured characteristic comprises a crest factor of the output signal.

13. The method of claim 12, wherein the carrier reference signal has a frequency equal to the first frequency.

14. The method of claim 13, wherein the multi-tone signal has a frequency equal to the first frequency.

15. The method of claim 11, wherein the electric circuit comprises an electric circuit embedded in a printed circuit board (PCB).

16. A system for testing an electric circuit, comprising:
    a carrier signal generator adapted to generate a carrier signal at a first frequency;
    a waveform generator adapted to generate a multi-tone signal;
    a modulator adapted to modulate the carrier signal with the multi-tone signal to generate a test signal and provide the test signal toward a circuit under test (CUT);

a characteristic measurement module adapted to determine a crest factor of an output signal from the circuit under test;

a comparator adapted to determine a crest factor differential between the crest factor and a reference crest factor; and an output module adapted to generate a signal indicating that the electric circuit is defective if the crest factor differential exceeds a threshold value.

17. The system of claim 16, wherein the test signal has a frequency equal to the first frequency.

18. The system of claim 17, wherein the multi-tone signal has a frequency equal to the first frequency.

\* \* \* \* \*